US010186363B2

(12) United States Patent
Matsuo et al.

(10) Patent No.: US 10,186,363 B2
(45) Date of Patent: Jan. 22, 2019

(54) MAGNETIC COMPONENT UNIT

(71) Applicant: PANASONIC INTELLECTUAL PROPERTY MANAGEMENT CO., LTD., Osaka (JP)

(72) Inventors: Mitsuhiro Matsuo, Fukushima (JP); Hiroshi Akamatsu, Fukushima (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 20 days.

(21) Appl. No.: 15/541,971

(22) PCT Filed: Jan. 8, 2016

(86) PCT No.: PCT/JP2016/000069

§ 371 (c)(1),
(2) Date: Jul. 6, 2017

(87) PCT Pub. No.: WO2016/117291

PCT Pub. Date: Jul. 28, 2016

(65) Prior Publication Data

US 2018/0019047 A1 Jan. 18, 2018

(30) Foreign Application Priority Data

Jan. 19, 2015 (JP) ................................ 2015-007374

(51) Int. Cl.
*H01F 27/26* (2006.01)
*H01F 27/30* (2006.01)
(Continued)

(52) U.S. Cl.
CPC .......... *H01F 27/26* (2013.01); *H01F 17/062* (2013.01); *H01F 27/06* (2013.01);
(Continued)

(58) Field of Classification Search
CPC ........ H01F 27/26; H01F 17/062; H01F 27/06; H01F 27/2823; H01F 27/30; H01F 27/306; H01F 3/14; H05K 7/2039
See application file for complete search history.

(56) References Cited

U.S. PATENT DOCUMENTS

2009/0108971 A1* 4/2009 Okamoto ............. H01F 27/266 336/65
2013/0077250 A1* 3/2013 Herbsommer .......... H02M 3/00 361/709

(Continued)

FOREIGN PATENT DOCUMENTS

JP S48-019916 3/1973
JP S50-143018 U 11/1975

(Continued)

OTHER PUBLICATIONS

International Search Report and Written Opinion issued in International Patent Application No. PCT/JP2016/000069, dated Mar. 15, 2016; with partial English translation.

*Primary Examiner* — Mohamad Musleh
(74) *Attorney, Agent, or Firm* — McDermott Will & Emery LLP

(57) ABSTRACT

A magnetic component unit in the present disclosure includes: a coil component; a heat dissipator which has an engagement fixing portion and a press fixing portion; and a magnetic core fixing portion. The magnetic core fixing portion includes: a holding portion that presses against the coil component; an engaging portion that extends from a first end part of the holding portion toward the heat dissipator and has a turned-back end part; and a pressing portion that extends from a second end part of the holding portion toward the heat dissipator and has an end part bent into an L-shape. The engagement fixing portion has a U-shape, and one end and the other end of the engagement fixing portion (Continued)

14 16 15A 15 15B 17 12 G1 G2 11 19 20 13 10C 10B 10A 21 10 17A 18 12A are connected to a peripheral edge portion of the heat dissipator. The press fixing portion has a columnar shape and is provided vertically protruding from the heat dissipator.

6 Claims, 3 Drawing Sheets

(51) Int. Cl.

| | |
|---|---|
| ***H01F 17/06*** | (2006.01) |
| ***H01F 27/28*** | (2006.01) |
| ***H05K 7/20*** | (2006.01) |
| ***H01F 27/06*** | (2006.01) |
| *H01F 3/14* | (2006.01) |

(52) U.S. Cl.

CPC ......... *H01F 27/2823* (2013.01); *H01F 27/30* (2013.01); *H01F 27/306* (2013.01); *H05K 7/2039* (2013.01); *H01F 3/14* (2013.01)

(56) References Cited

U.S. PATENT DOCUMENTS

| | | | | |
|---|---|---|---|---|
| 2014/0266527 A1* | 9/2014 | Vafakhah | .................. | H01F 3/14 336/65 |
| 2015/0155088 A1* | 6/2015 | Lee | ......................... | H01F 27/22 336/61 |
| 2016/0189846 A1* | 6/2016 | Miyauchi | ................ | H01F 17/04 336/61 |

FOREIGN PATENT DOCUMENTS

| | | |
|---|---|---|
| JP | 2002-076655 A | 3/2002 |
| JP | 2002-208521 A | 7/2002 |
| JP | 2011-253877 A | 12/2011 |

* cited by examiner 10
10A
21
13
19
11
12
18
9
17
15B
15
15A
16
14

MAGNETIC COMPONENT UNIT

RELATED APPLICATIONS

This application is the U.S. National Phase under 35 U.S.C. § 371 of International Patent Application No. PCT/JP2016/000069, filed on Jan. 8, 2016, which in turn claims the benefit of Japanese Application No. 2015-007374, filed on Jan. 19, 2015, the entire disclosures of which Applications are incorporated by reference herein.

TECHNICAL FIELD

The present disclosure relates to a magnetic component unit for use in various electronic devices.

BACKGROUND ART

Hereinafter, a conventional magnetic component unit will be described with reference to the drawings. In FIG. 5, which is a perspective view illustrating the configuration of the conventional magnetic component unit, coil component 4 having magnetic core 1, two terminal portions 2, and winding portion 3 is mounted on heat dissipator 5. Furthermore, fixing member 6 presses against magnetic core 1 to fix coil component 4 to heat dissipator 5.

Note that Patent Literature (PTL) 1, for example, is known as related art document information pertaining to the present application.

CITATION LIST

Patent Literature

PTL 1: Unexamined Japanese Patent Publication No. 2002-208521

SUMMARY OF THE INVENTION

A magnetic component unit in the present disclosure includes: a coil component having a magnetic core; and a heat dissipator on which the coil component is mounted and which has an engagement fixing portion and a press fixing portion and is made of metal. Furthermore, the magnetic component unit in the present disclosure includes a magnetic core fixing portion. The magnetic core fixing portion is made of metal and includes: a holding portion that presses against the coil component; an engaging portion that extends from a first end part of the holding portion toward the heat dissipator and has a turned-back end part; and a pressing portion that extends from a second end part of the holding portion toward the heat dissipator and has an end part bent into an L-shape. The engagement fixing portion has a U-shape, and one end and the other end of the engagement fixing portion are connected to a peripheral edge portion of the heat dissipator. Furthermore, the engagement fixing portion is provided protruding from the peripheral edge portion of the heat dissipator in a first direction perpendicular to a mounting surface of the heat dissipator and the engagement fixing portion engages the engaging portion. The press fixing portion has a columnar shape and is provided protruding from the heat dissipator in the first direction, and the press fixing portion has a fixing hole punched in the first direction. The pressing portion has a through-hole punched in the first direction, and the press fixing portion and the pressing portion are joined together by a fixing tool inserted through the through-hole and the fixing hole. The coil component is held between the holding portion and the heat dissipator.

DESCRIPTION OF EMBODIMENTS

Before description of a magnetic component unit according to the present exemplary embodiment, a problem with the conventional magnetic component unit disclosed in PTL 1 will be described.

Figure 5:
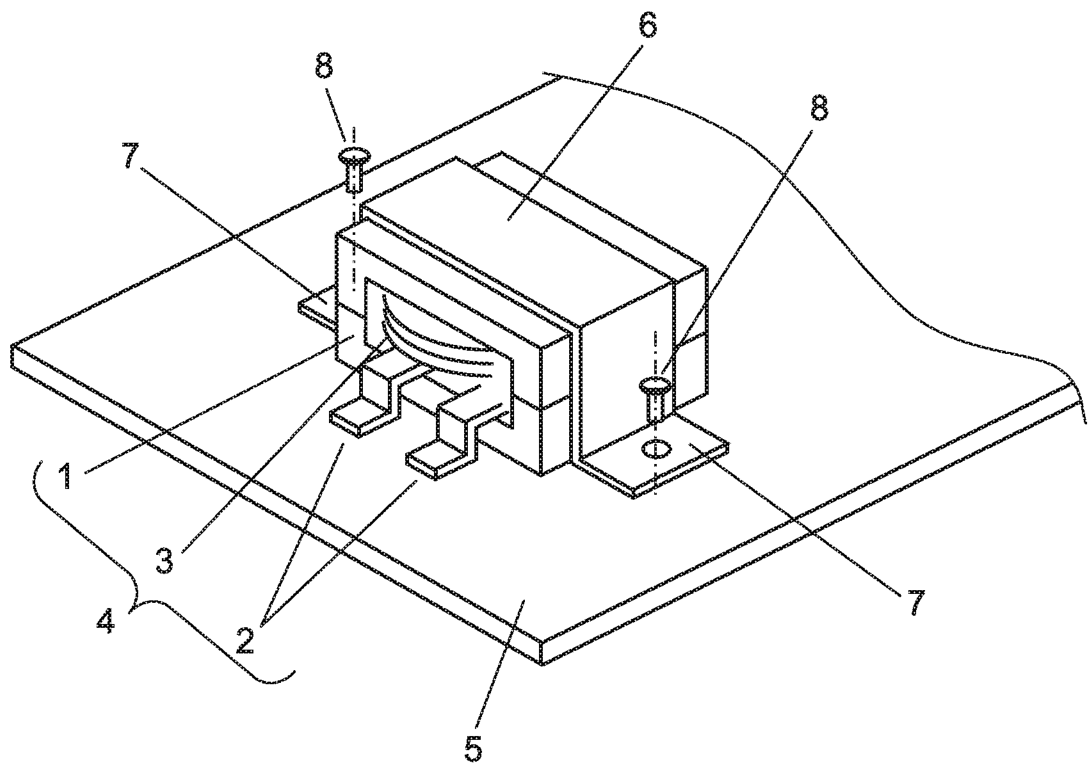
FIG. 5 is a perspective view of a conventional magnetic component unit.

In the conventional magnetic component unit described with reference to FIG. 5, when fixing member 6 is joined to heat dissipator 5, joining portions provided at both end parts of fixing member 6 are joined to heat dissipator 5 by fixing means 8.

With the configuration of the conventional magnetic component unit, an increase in the size of coil component 4 leads to an increase in the size of each of fixing member 6, joining portion 7, and fixing means 8 as well, resulting in an increase in the plan view area of joining portion 7.

In the conventional magnetic component unit, the size of coil component 4 increases with an increase in the electricity to be handled. The increase in the size of coil component 4 leads to an increase in the area of joining portion 7 as well, in addition to an increase in the area for mounting coil component 4. Thus, the area and the volume of the magnetic component unit increase more than increases in the area and the volume of coil component 4.

Thus, an object of the present disclosure is to reduce the increase in the size of the magnetic component unit.

Hereinafter, an exemplary embodiment of the present disclosure will be described with reference to the drawings.

Exemplary Embodiment

Figure 1:
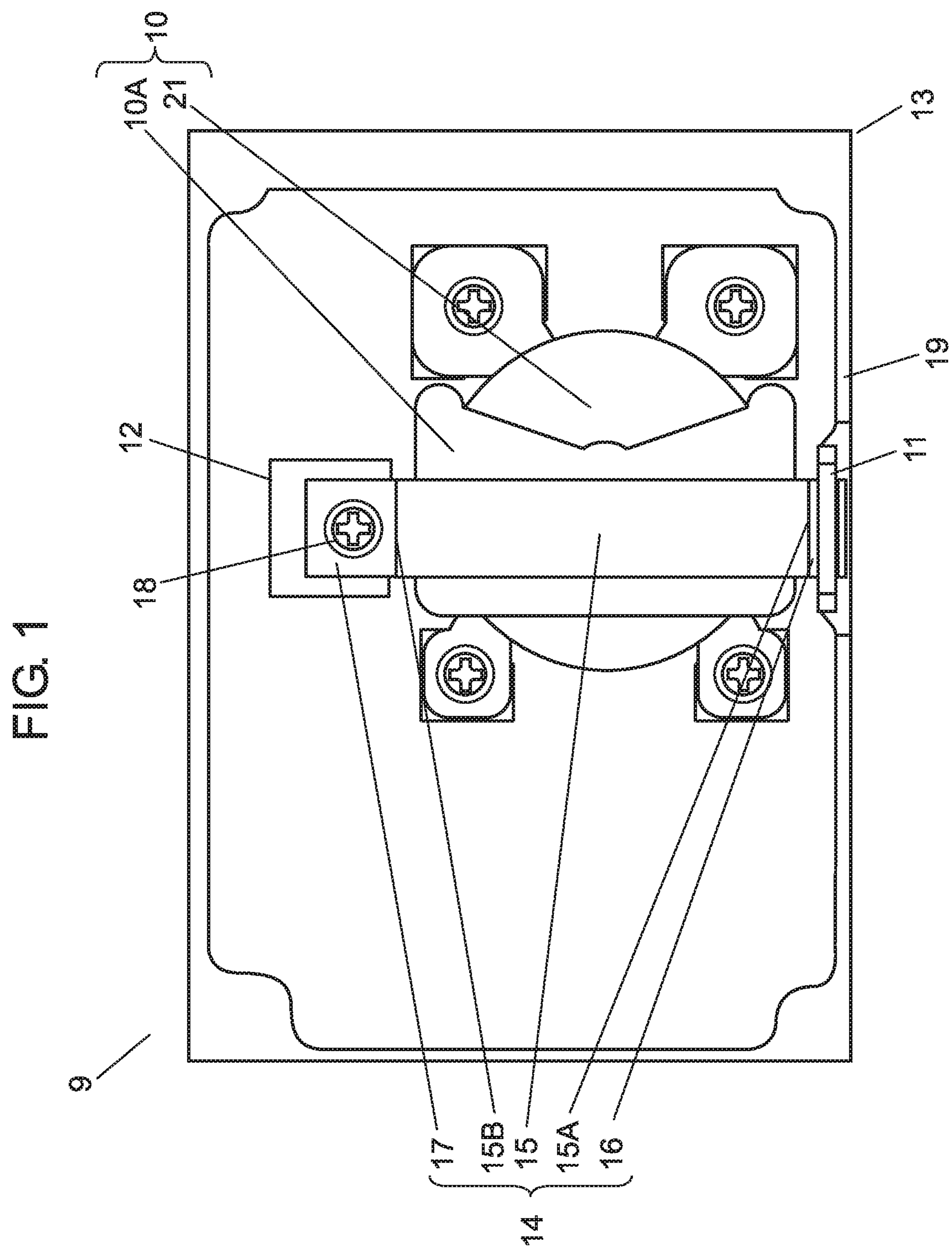
FIG. 1 is a top view illustrating a configuration of a magnetic component unit according to an exemplary embodiment of the present disclosure.
Figure 2:
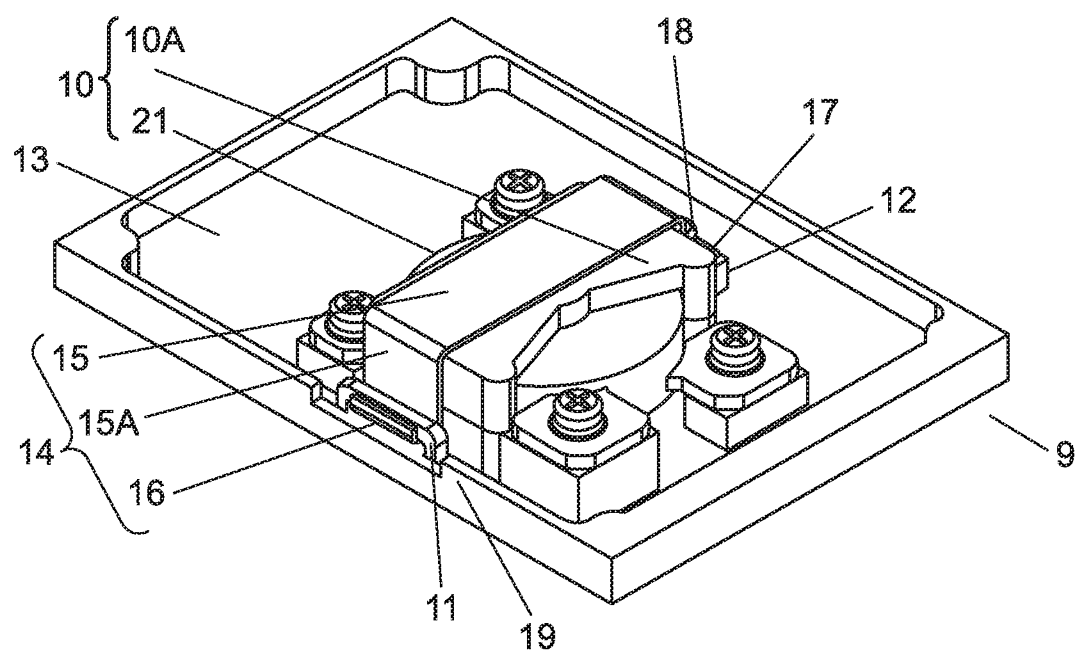
FIG. 2 is a perspective view illustrating a configuration of a magnetic component unit according to an exemplary embodiment of the present disclosure.
Figure 3:
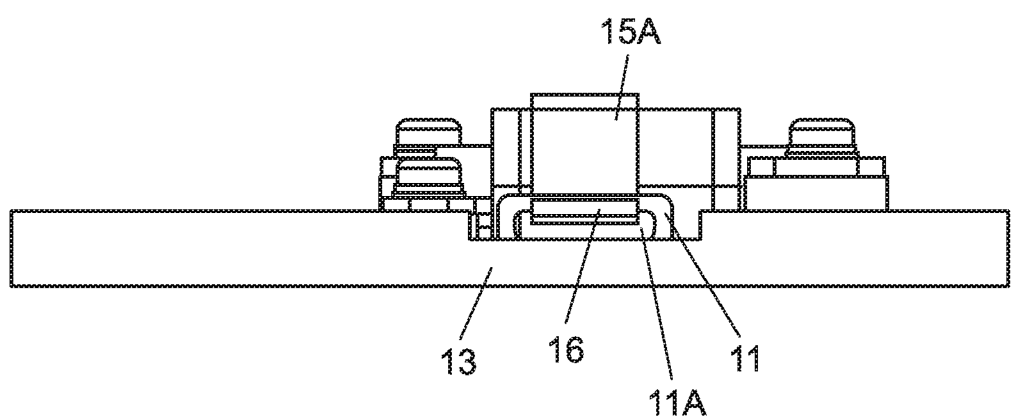
FIG. 3 is a side view illustrating a configuration of a magnetic component unit according to an exemplary embodiment of the present disclosure.
Figure 4:
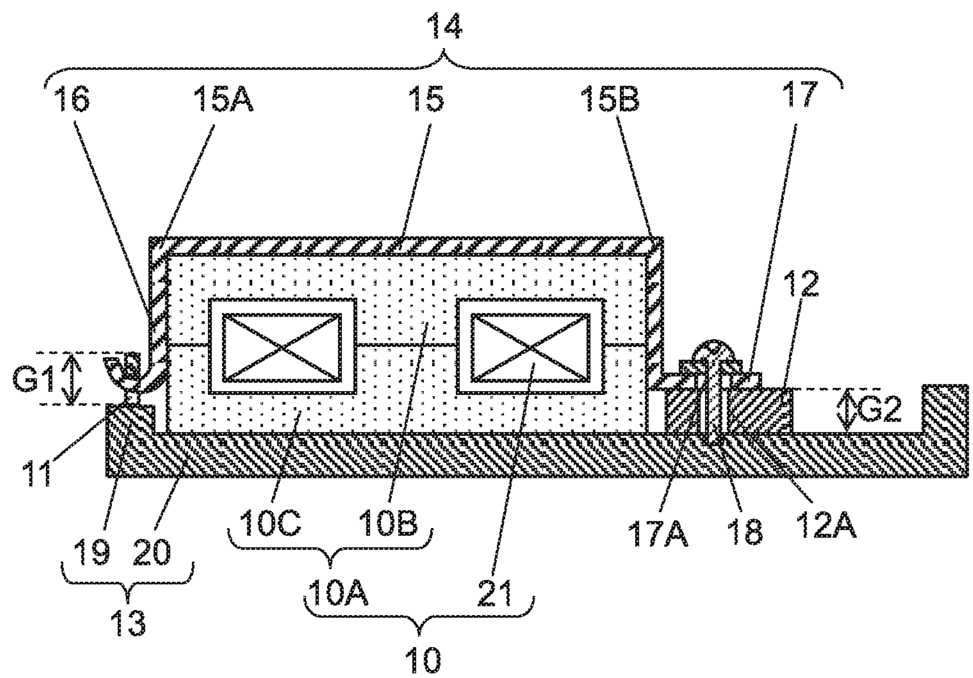
FIG. 4 is a cross-sectional view schematically illustrating a configuration of a magnetic component unit according to an exemplary embodiment of the present disclosure.

FIG. 1 is a top view illustrating a configuration of a magnetic component unit according to an exemplary embodiment of the present disclosure, FIG. 2 is a perspective view illustrating the configuration of magnetic component unit 9 according to the exemplary embodiment of the present disclosure, FIG. 3 is a side view illustrating the configuration of magnetic component unit 9 according to the exemplary embodiment of the present disclosure, and FIG. 4 is a cross-sectional view schematically illustrating the configuration of magnetic component unit 9 according to the exemplary embodiment of the present disclosure.

Magnetic component unit 9 includes: coil component 10 having magnetic core 10A and winding portion 21; heat dissipator 13 on which coil component 10 is mounted and which has engagement fixing portion 11 and press fixing portion 12 and is made of metal; and magnetic core fixing portion 14 made of metal.

Magnetic core fixing portion 14 holds magnetic core 10A. Magnetic core fixing portion 14 includes holding portion 15, engaging portion 16, and pressing portion 17. Both ends of magnetic core fixing portion 14 are bent; engaging portion 16 is formed at one end and pressing portion 17 is formed at the other end. In other words, engaging portion 16 extends from end part 15A of holding portion 15, and pressing portion 17 extends from end part 15B of holding portion 15. Engaging portion 16 is formed by being turned back into a U-shape, as illustrated in FIG. 4, and pressing portion 17 is formed by being bent into an L-shape. Note that it is sufficient that engaging portion 16 be turned back to catch engagement fixing portion 11; the shape of the turned-back end part is not limited to the U-shape and may be, for example, a V-shape.

Engagement fixing portion 11 extends vertically from peripheral edge portion 19 of heat dissipator 13 as a whole. Note that in the present exemplary embodiment, mounting surface 20 of heat dissipator 13 on which coil component 10 is mounted is defined as being "horizontal" and a direction perpendicular to mounting surface 20 of heat dissipator 13 is defined as being "vertical".

Furthermore, engagement fixing portion 11 is in engagement with engaging portion 16. Similarly to engagement fixing portion 11, press fixing portion 12 is provided protruding in a columnar fashion from heat dissipator 13 vertically with respect to the mounting surface of heat dissipator 13 for coil component 10. Press fixing portion 12 has fixing hole 12A punched vertically with respect to the mounting surface for coil component 10. Fixing tool 18 is inserted through through-hole 17A of pressing portion 17 and fixing hole 12A so that pressing portion 17 and press fixing portion 12 are joined together. Coil component 10 is held between holding portion 15 and heat dissipator 13. Engaging portion 16 and engagement fixing portion 11 are disposed on peripheral edge portion 19 of heat dissipator 13.

Thus, magnetic component unit 9 according to the present exemplary embodiment includes: coil component 10 having magnetic core 10A; the heat dissipator on which coil component 10 is mounted and which has engagement fixing portion 11 and press fixing portion 12 and is made of metal; and magnetic core fixing portion 14. Magnetic core fixing portion 14 is made of metal and includes: holding portion 15 that presses coil component 10; engaging portion 16 that extends from end part 15A of holding portion 15 toward heat dissipator 13 and has a turned-back end part; and pressing portion 17 that extends from end part 15B of holding portion 15 toward heat dissipator 13 and has an end part bent into an L-shape. Engagement fixing portion 11 has a U-shape, and one end and the other end of engagement fixing portion 11 are connected to peripheral edge portion 19 of heat dissipator 13. Furthermore, engagement fixing portion 11 is provided protruding from peripheral edge portion 19 of heat dissipator 13 in a direction perpendicular (vertically) to mounting surface 20 of heat dissipator 13. Furthermore, engagement fixing portion 11 is in engagement with engaging portion 16. Press fixing portion 12 has a columnar shape and is provided vertically protruding from heat dissipator 13. Furthermore, press fixing portion 12 has fixing hole 12A punched vertically, and pressing portion 17 has through-hole 17A punched vertically. Press fixing portion 12 and pressing portion 17 are joined together by fixing tool 18 inserted through through-hole 17A and fixing hole 12A. Coil component 10 is held between holding portion 15 and heat dissipator 13.

As described above, magnetic component unit 9 according to the present exemplary embodiment does not require other members to fix engaging portion 16 and engagement fixing portion 11. Engaging portion 16 and engagement fixing portion 11 engage each other and are fixed to peripheral edge portion 19. In other words, there is no need to provide members for fixing engaging portion 16 and engagement fixing portion 11, and thus it is not necessary to provide space for the members for fixing on heat dissipator 13 around engaging portion 16 and engagement fixing portion 11. Engaging portion 16 is not fixed using a member for fixing (for example, a screw) on peripheral edge portion 19 of heat dissipator 13 to which engagement fixing portion 11 is fixed. Therefore, there is no need to increase the area of heat dissipator 13 to provide fixing members for engagement fixing portion 11 and engaging portion 16 on peripheral edge portion 19 of heat dissipator 13 to which engagement fixing portion 11 and engaging portion 16 are fixed.

Pressing portion 17 extending from end part 15B of holding portion 15 is fixed to press fixing portion 12 on the mounting surface of heat dissipator 13 by using fixing tool 18. Press fixing portion 12 is provided on heat dissipator 13 in a region closer to the center thereof than peripheral edge portion 19.

With the above configuration, one side of coil component 10 is fixed in engagement and press fixing portion 12 requiring an area on heat dissipator 13 is provided only on one side of coil component 10 in magnetic component unit 9 in the present disclosure.

Thus, in magnetic component unit 9, one side of coil component 10 is fixed in engagement so that coil component 10 is securely fixed to heat dissipator 13 and even when the size of coil component 10 increases with an increase in the electricity to be handled, the increase in the area on heat dissipator 13 can be reduced because press fixing portion 12 and pressing portion 17 are provided only on one side. As a result, the increases in the plan view area and the volume of magnetic component unit 9 are reduced.

Next, the configuration of magnetic component unit 9 will be described in detail. As described above, holding portion 15 presses coil component 10 including magnetic core 10A against heat dissipator 13 and holds coil component 10 in place in magnetic component unit 9. With this configuration, coil component 10 is fixed to heat dissipator 13. Magnetic core fixing portion 14 is formed by the process of bending a belt-shaped metal sheet or metal strip made of iron, copper, or an alloy such as stainless steel. Engaging portion 16 is formed extending from end part 15A of holding portion 15. Pressing portion 17 is formed extending from end part 15B of holding portion 15 and has through-hole 17A at an end part. Furthermore, magnetic core fixing portion 14 including holding portion 15 has elasticity for securely pressing coil component 10 against heat dissipator 13. In other words, the material, shape, etc., of holding portion 15 have spring properties, and thus holding portion 15 can obtain an appropriate pressing force against heat dissipator 13 from coil component 10. Note that coil component 10 may be directly pressed against heat dissipator 13 by holding portion 15 or may be pressed against heat dissipator 13 with an adhesive (not illustrated in the drawings) or a resin sheet (not illustrated in the drawings) interposed between coil component 10 and heat dissipator 13.

The configurations of engaging portion 16, engagement fixing portion 11, pressing portion 17, and press fixing portion 12 are described in detail below with reference to FIG. 2 and FIG. 4.

Engaging portion 16 extends from end part 15A of holding portion 15 toward heat dissipator 13 (in FIG. 4, downward), an end part of engaging portion 16 is turned back to form a U-shape, and the end part of engaging portion 16 is in engagement with engagement fixing portion 11. Note that although the end part is turned back to form a U-shape in the present exemplary embodiment, the end part may be turned back at an acute angle to form a V-shape or may be turned back to form another shape. In essence, it is sufficient that the end part of engaging portion 16 be in engagement with engagement fixing portion 11. Heat dissipator 13 is formed using metal such as aluminum which has good thermal conductivity. Engagement fixing portion 11 protrudes upward from peripheral edge portion 19 of heat dissipator 13. Engagement fixing portion 11 is provided on peripheral edge portion 19, and the shape of engagement fixing portion 11 has an inverted U-shape, as illustrated in FIG. 2. In other words, assuming that mounting surface 20 of heat dissipator 13 is horizontal, engagement fixing portion 11 protrudes upward (vertically) from peripheral edge portion 19 of heat dissipator 13 as a whole.

Meanwhile, pressing portion 17 extends downward (toward mounting surface 20 of heat dissipator 13) from end part 15B. Pressing portion 17 is formed by being bent at a right angle and further extending horizontally (in parallel with mounting surface 20). Furthermore, an end part of pressing portion 17 which extends horizontally has through-hole 17A.

Press fixing portion 12 has a cubic shape or a cuboid shape or has a columnar shape similar to these shapes and protrudes upward (vertically) from mounting surface 20 of heat dissipator 13. Press fixing portion 12 is formed to have a columnar shape and have a larger cross-sectional area in a plane direction than that of engagement fixing portion 11 provided on peripheral edge portion 19. Thus, the area of press fixing portion 12 that is in contact with heat dissipator 13 is larger than the area of engaging portion 16 that is in contact with heat dissipator 13. Furthermore, press fixing portion 12 cannot be provided on peripheral edge portion 19 of heat dissipator 13 because the area of the base of press fixing portion 12 is large, and thus press fixing portion 12 is provided on mounting surface 20 in a region closer to the center thereof than peripheral edge portion 19.

Furthermore, press fixing portion 12 has fixing hole 12A provided vertically with respect to mounting surface 20 of heat dissipator 13. Fixing tool 18 such as a screw is inserted through fixing hole 12A and through-hole 17A to join press fixing portion 12 and pressing portion 17 together, and as a result, coil component 10 is fixed to heat dissipator 13.

In magnetic component unit 9 according to the present exemplary embodiment, coil component 10 is fixed to heat dissipator 13 in two places, i.e., at engagement fixing portion 11 and press fixing portion 12. Only press fixing portion 12 requires a large area of heat dissipator 13, and engagement fixing portion 11 hardly requires an area of heat dissipator 10. Thus, the increases in the plan view area and the volume of magnetic component unit 9 are reduced.

Next, the heat transfer from coil component 10 to heat dissipator 13 is described in detail.

Magnetic core fixing portion 14 has a function of transferring heat generated in coil component 10 to heat dissipator 13. The heat transferred from magnetic core fixing portion 14 to heat dissipator 13 is diffused by heat dissipator 13 due to this function. Furthermore, the heat is dissipated from heat dissipator 13 exteriorly of heat dissipator 13. There are two paths for the heat to be transferred from magnetic core fixing portion 14 to heat dissipator 13.

In the first path, the heat released from magnetic core 10A of coil component 10 is transferred sequentially to magnetic core fixing portion 14, engaging portion 16, and heat dissipator 13. In the second path, the heat released from magnetic core 101 of coil component 10 is transferred sequentially to magnetic core fixing portion 14, press fixing portion 12, and heat dissipator 13.

Note that in practice, there is also a path in which the heat generated in magnetic core 10A is transferred directly to heat dissipator 13 from the faces of coil component 10 and magnetic core 101 that are in contact with heat dissipator 13. Description in the present disclosure, however, focuses on the first path and the second path.

In the present exemplary embodiment, magnetic core 10A includes magnetic core segment 10B and magnetic core segment 10C, and thus description is given of heat dissipation from magnetic core segment 10B located on the upper side in FIG. 4 (magnetic core segment 10B which is one of the magnetic core segments that is separated from the mounting surface of heat dissipator 13).

In the first path, heat is transferred from engaging portion 16 of magnetic core fixing portion 14 to engagement fixing portion 11 on heat dissipator 13. Since magnetic core fixing portion 14 including engaging portion 16 is formed by bending a belt-like metal sheet, engaging portion 16 and engagement fixing portion 11 are not planarly, but roughly linearly in contact with each other. In particular, when engaging portion 16 is formed into a U-shape, a V-shape, or the like and engagement fixing portion 11 is formed into an inverted U-shape, engaging portion 16 and engagement fixing portion 11 are in line contact with each other, and thus the area of contact between engaging portion 16 and engagement fixing portion 11 is very small.

With this configuration, the heat transfer from engaging portion 16 to engagement fixing portion 11 has high thermal resistance. Furthermore, since engagement fixing portion 11 has an inverted U-shape, engagement fixing portion 11 has high thermal resistance between a part close to heat dissipator 13 and a part away from heat dissipator 13.

Thus, heat is not easily transferred through the first path in which the heat is transferred sequentially to coil component 10, engaging portion 16, engagement fixing portion 11, and heat dissipator 13.

Heat is more easily transferred through the second path than through the first path. In the state where pressing portion 17 and press fixing portion 12 are joined together using fixing tool 18, heat is transferred from pressing portion 17 to press fixing portion 12 through the second path. Pressing portion 17 and press fixing portion 12 are in planar contact with each other. Thus, the area of contact between pressing portion 17 and press fixing portion 12 is very large compared to the area of contact between engaging portion 16 and engagement fixing portion 11. The second path has very lower thermal resistance than the first path. Thus, heat is significantly more easily transferred through the second path in which the heat is transferred from coil component 10 to heat dissipator 13 through pressing portion 17 and press fixing portion 12 than through the first path.

As described above, in the second path, press fixing portion 12 is not disposed at a displaced position (in the present exemplary embodiment, on peripheral edge portion 19) on heat dissipator 13, and thus heat dissipator 13 can more effectively diffuse and dissipate heat from the second path than from the first path. In other words, engagement fixing portion 11 which engaging portion 16 engages is disposed on peripheral edge portion 19 of heat dissipator 13. Meanwhile, press fixing portion 12 to which pressing portion 17 is joined is formed on mounting surface 20 of heat dissipator 13 and is formed protruding vertically. Press fixing portion 12 is formed on mounting surface 20 of heat dissipator 13, and mounting surface 20 spreads out to a region around the installation position of press fixing portion 12. Thus, the heat transferred to heat dissipator 13 through the second path is very easily dissipated.

The heat generated in coil component 10 is diffused to peripheral edge portion 19 through pressing portion 17 and press fixing portion 12 from a region of heat dissipator 13 that is closer to the center thereof than peripheral edge portion 19. Thus, the heat generated in coil component 10 is efficiently transferred from press fixing portion 12 to entire heat dissipator 13. As a result, the heat transferred to heat dissipator 13 is efficiently dissipated exteriorly from heat dissipator 13. Thus, with this configuration, the temperature of part of peripheral edge portion 19 of heat dissipator 13 is less likely to increase locally. Accordingly, particularly when heat dissipator 13 has a plate shape or even when heat dissipator 13 has a plate shape, a smaller thickness, and a low heat capacity, heat distribution concentrated on the periphery of heat dissipator 13 or deformation of heat dissipator 13 due to heat, for example, is inhibited.

Furthermore, press fixing portion 12 is provided on mounting surface 20 of heat dissipator 13 formed into a plate shape, on which coil component 10 is mounted, so as to protrude in a columnar fashion from mounting surface 20. In the above-described configuration of magnetic component unit 9 according to the present exemplary embodiment, many regions with high heat-transfer efficiency are present between magnetic core 10A and heat dissipator 13. This improves the properties of heat transfer from magnetic core 10A to heat dissipator 13.

In other words, the heat generated in coil component 10 is easily transferred to heat dissipator 13 through press fixing portion 12, and in heat dissipator 13, the heat is diffused to the entirety thereof from a region closer to the center thereof than peripheral edge portion 19. Heat dissipator 13 has improved heat dissipation efficiency.

Note that press fixing portion 12 may be formed of metal, a ceramic, or the like which is different from heat dissipator 13. Alternatively press fixing portion 12 may be formed of metal, a ceramic, or the like which is the same as heat dissipator 13, and press fixing portion 12 and heat dissipator 13 may be integrally formed.

When press fixing portion 12 is formed of metal, a ceramic, or the like which is different from heat dissipator 13, it is desirable that press fixing portion 12 have higher heat transfer properties than heat dissipator 13. With this configuration, the heat transfer properties of the second path further improve, and as a result, the heat transfer properties of heat dissipator 13 improve. In this configuration, press fixing portion 12 and heat dissipator 13 are joined together by fixing tool 18. Note that when press fixing portion 12 and heat dissipator 13 are integrally formed, there is no surface of discontinuity between press fixing portion 12 and heat dissipator 13, and thus the properties of heat transfer from press fixing portion 12 to heat dissipator 13 are stable at an enhanced level.

Engagement fixing portion 11 is the same as press fixing portion 12 in that engagement fixing portion 11 and heat dissipator 13 may be integrally formed. When engagement fixing portion 11 and heat dissipator 13 are integrally formed, effects are obtained which are the same as those obtained when press fixing portion 12 and heat dissipator 13 are integrally formed.

Next, the relationship between height G1 of engagement fixing portion 11 measured from heat dissipator 13 (peripheral edge portion 19) and height G2 of press fixing portion 12 measured from heat dissipator 13 is described with reference to FIG. 4.

The relationship between height G1 and height G2 influences the heat dissipation efficiency of heat dissipator 13 for heat transferred from magnetic core 10A through magnetic core fixing portion 14. When height G1 of engagement fixing portion 11 protruding from heat dissipator 13 is greater than height G2 of press fixing portion 12 protruding from heat dissipator 13, the heat dissipation efficiency of heat dissipator 13 improves.

Furthermore, the length of the path for heat to be transferred from end part 15A of holding portion 15 to engagement fixing portion 11 is set shorter than the length of the path for heat to be transferred from end part 15B of holding portion 15 to press fixing portion 12, improving the heat dissipation efficiency of heat dissipator 13.

As described earlier, when the turned-back end part of engaging portion 16 has a V-shape or a U-shape, engaging portion 16 and engagement fixing portion 11 are not planarly but roughly linearly, in contact with each other. Therefore, the thermal resistance between engaging portion 16 and engagement fixing portion 11 is high. Meanwhile, pressing portion 17 and press fixing portion 12 are joined together using fixing tool 18 and thus are roughly planarly in contact with each other. Therefore, the thermal resistance between pressing portion 17 and press fixing portion 12 is low.

Furthermore, since engagement fixing portion 11 has a U-shape, the cross-sectional area of the path for heat transfer is small. The cross-sectional area of engagement fixing portion 11 is significantly smaller than the cross-sectional area of engaging portion 16, and thus the path from engaging portion 16 to heat dissipator 13 has further increased thermal resistance.

Meanwhile, press fixing portion 12 has a columnar shape or a block shape and therefore, the path therein for heat transfer has a very large cross-sectional area compared to that in engagement fixing portion 11. Thus, the thermal resistance of press fixing portion 12 is very low. As a result, regarding the path of heat transfer from holding portion 15 to heat dissipator 13, the path passing through pressing portion 17 and press fixing portion 12 has higher heat transfer properties than the path passing through engaging portion 16 and engagement fixing portion 11.

Furthermore, in the present exemplary embodiment, height G1 of engagement fixing portion 11 protruding from heat dissipator 13 is set greater than height G2 of press fixing portion 12 protruding from heat dissipator 13.

Thus, the height of engagement fixing portion 11 measured from heat dissipator 13 is greater than the height of press fixing portion 12 measured from heat dissipator 13. More specifically, the height of a part at which engagement fixing portion 11 and engaging portion 16 are in engagement, measured from heat dissipator 13, is greater than the height of press fixing portion 12 measured from heat dissipator 13. With this configuration, the path passing through engagement fixing portion 11 having a small cross-sectional area and very varying heat transfer properties depending on the height is longer than the path passing through press fixing portion 12 having a large cross-sectional area which results in small variations in the heat transfer properties depending on variations in the height. In other words, engaging portion 16 and engagement fixing portion 11 are linearly in contact with each other, and the path in engagement fixing portion 11 has a small cross-sectional area and therefore has low heat transfer efficiency; thus, the path in engagement fixing portion 11 is long. With this configuration, the first path including engaging portion 16 and engagement fixing portion 11 has further reduced heat transfer properties compared to the second path including pressing portion 17 and press fixing portion 12.

As a result, the heat transferred from magnetic core 10A to holding portion 15 is very easily transferred from end part 15B to heat dissipator 13 through pressing portion 17 and press fixing portion 12. Press fixing portion 12 is disposed above and in planar contact with heat dissipator 13. Note that press fixing portion 12 does not necessarily need to be fixed to heat dissipator 13 by fixing tool 18; press fixing portion 12 and heat dissipator 13 may be integrally formed. In addition, as described earlier, the heat transfer from press fixing portion 12 to heat dissipator 13 is not concentrated on peripheral edge portion 19 of heat dissipator 13. Thus, the heat transferred from press fixing portion 12 to heat dissipator 13 is easily smoothly diffused to entire heat dissipator 13, improving the heat dissipation efficiency of heat dissipator 13.

As described above, height G1 of engagement fixing portion 11 protruding from heat dissipator 13 is set greater than height G2 of press fixing portion 12 protruding from heat dissipator 13, and thus the heat dissipation efficiency of heat dissipator 13 and the heat dissipation efficiency of entire magnetic component unit 9 improve.

Furthermore, U-shaped engagement fixing portion 11 can protrude significantly from heat dissipator 13 to enlarge air-cored portion 11A (see FIG. 3) and thereby reduce the length of engaging portion 16. The enlargement of air-cored portion 11A facilitates the task of bringing engaging portion 16 into engagement with engagement fixing portion 11 during assembly of magnetic component unit 9.

Furthermore, as described above, pressing portion 17 and press fixing portion 12 are joined together in planar contact, and the thermal resistance due to the joining is low. Moreover, the cross-sectional area of press fixing portion 12 in the protruding direction thereof is large and thus, variations in the heat transfer properties of press fixing portion 12 depending on variations in the height are small. Accordingly it is more preferable that the area of press fixing portion 12 in the plane in which press fixing portion 12 and pressing portion 17 are joined together be set greater than or equal to the area of pressing portion 17 in said plane so that the thermal resistance due to the joining and the variations in the heat transfer properties are minimized. In the present exemplary embodiment, pressing portion 17 may be joined to press fixing portion 12 in as large an area as possible in the plane in which press fixing portion 12 and pressing portion 17 are joined together. An increase in the area in which press fixing portion 12 and pressing portion 17 are in contact with each other allows the heat passing through the second path to be more easily transferred to heat dissipator 13, resulting in an increase in the heat dissipation efficiency of heat dissipator 13.

In order that pressing portion 17 is joined to press fixing portion 12 in as large an area as possible, the area of press fixing portion 12 may be set equal to the area of contact between press fixing portion 12 and pressing portion 17 or greater than the area of contact between press fixing portion 12 and pressing portion 17 as seen in plan view, as illustrated in FIG. 1. The plan view herein means a view seen from above, as illustrated in FIG. 1.

Furthermore, when magnetic component unit 9 is used for an in-vehicle power supply or the like, press fixing portion 12 and pressing portion 17 may be disposed on the side on which heat dissipator 13 is susceptible to the impacts of vibrations, shocks, and so on, and engagement fixing portion 11 and engaging portion 16 may be disposed on the side on which heat dissipator 13 is not susceptible to the impacts of vibrations, shocks, and so on.

In other words, it is sufficient that magnetic component unit 9 according to the present exemplary embodiment be configured using the fixing through engagement and the fixing through pressing, which is firmer than engagement, for different regions on heat dissipator 13, instead of using a large area in every region on heat dissipator 13 to maintain a stationary state with excessive fixing strength.

In essence, the fixing through pressing may be used for a part requiring firm fixing, and the fixing through engagement may be used for a part causing no problems with lower fixing strength than that of the fixing through pressing. Coil component 10 can be in a more stable stationary state, for example, when the fixing strength is checked and then the fixing through engagement and the fixing through pressing are used for different regions as described above.

According to the present exemplary embodiment, the increase in area due to mounting, fixing, etc., of coil component 10 including magnetic core fixing portion 14 is reduced.

As described above, for example, for coil component 10, press fixing portion 12 and pressing portion 17 may be disposed on heat dissipator 13 in a position under high external stress, and engagement fixing portion 11 and engaging portion 16 may be disposed on heat dissipator 13 in a position under relatively low stress. In addition, engagement fixing portion 11 is disposed on heat dissipator 13 in a position on the peripheral edge portion 19 side, and press fixing portion 12 is disposed on heat dissipator 13 in a position closer to the center thereof than peripheral edge portion 19. This configuration makes it possible to downsize magnetic component unit 9 and furthermore, improves the properties of magnetic component unit 9 related to the heat transfer, the heat dissipation, etc.

Specifically, when coil component 10 described at the beginning is increased in size, engagement fixing portion 11 is disposed on heat dissipator 13 in a position under low stress, and press fixing portion 12 is disposed on heat dissipator 13 in a position under high stress. Thus, press fixing portion 12 and pressing portion 17 occupy a large area on heat dissipator 13. Meanwhile, engagement fixing portion 11 is disposed on peripheral edge portion 19. Therefore, the area on heat dissipator 13 which engagement fixing portion 11 occupies is unlikely to depend on the size of coil component 10 and is hardly affected by the size of coil component 10. Thus, the increases in the plan view area and the volume of magnetic component unit 9 can be limited to values corresponding to the increases in size of coil component 10 and single press fixing portion 12. Furthermore, when the area in which press fixing portion 12 and heat dissipator 13 face each other increases, the position in which fixing hole 12A of press fixing portion 12 is provided is distanced from the periphery of heat dissipator 13. Thus, the heat generated in coil component 10 is diffused toward the periphery of heat dissipator 13 from the region roughly closer to the center thereof than peripheral edge portion 19 and is efficiently dissipated from heat dissipator 13 exteriorly of heat dissipator 13.

Note that coil component 10 and other devices (not illustrated in the drawings) may be disposed on a resin layer (not illustrated in the drawings) provided on mounting surface 20 of heat dissipator 13 for the purpose of, for example, improving the insulating properties and improving the heat transfer properties. The outer periphery of the resin layer may be located further inward than the outer periphery of heat dissipator 13, and the outer peripheral region of heat dissipator 13 that is located further outward than the outer periphery of the resin layer may be defined as peripheral edge portion 19. Engagement fixing portion 11 may be formed on peripheral edge portion 19 of heat dissipator 13 so as to extend vertically with respect to the mounting surface of heat dissipator 13. Alternatively a region corresponding to the resin layer may be provided in a recessed region of plate-shaped heat dissipator 13, and peripheral edge portion 19 may be provided as a wall-shaped region on the outer periphery of heat dissipator 13. Peripheral edge portion 19 of heat dissipator 13 may be formed into a wall shape by vertically protruding from heat dissipator 13 without the resin layer being provided.

Engaging portion 16 is formed by being turned back from end part 15A of holding portion 15 toward the side on which peripheral edge portion 19 of heat dissipator 13 is located. Specifically, the leading end (an end part on the opposite side from an end part connected to end part 15A of holding portion 15) of engaging portion 16 passes through air-cored portion 11A of engagement fixing portion 11 (see FIG. 3) from the center area toward the outside of heat dissipator 13. As illustrated in FIG. 1, the leading end of engaging portion 16 is located further inward than the outermost periphery of peripheral edge portion 19 in heat dissipator 13. In other words, the leading end of engaging portion 16 does not protrude outward beyond peripheral edge portion 19 of heat dissipator 13. Accordingly, the plan view area of magnetic component unit 9 does not need to be increased to form engaging portion 16 and engagement fixing portion 11. Thus, since the leading end part of engaging portion 16 does not protrude from peripheral edge portion 19 of heat dissipator 13, the increase in the volume of magnetic component unit 9 is reduced. In addition, since the leading end part of engaging portion 16 does not protrude from peripheral edge portion 19 of heat dissipator 13, this cuboid or the like shape improves the handleability upon assembly, connection, etc.

Note that although the present exemplary embodiment describes that a screw is used as fixing tool 18, fixing tool 18 is not limited to the screw; for example, bolt-like or rivet-like fixing tool 18 may be used. In the present exemplary embodiment, the use of fixing tool 18 allows pressing portion 17 and press fixing portion 12 to be in planar contact to stably maintain the stationary state thereof.

Coil component 10 may be a transformer or may be a choke coil as long as coil component 10 has at least magnetic core 10A and winding portion 21.

It is sufficient that heat dissipator 13 on which coil component 10 is mounted be a structure having a heat dissipation function. For example, heat dissipator 13 may be a structure that is a mounting substrate such as a resin substrate and has the heat dissipation function and other functions. It is desirable that heat dissipator 13 be a structure formed of aluminum, an aluminum alloy or the like that has a high heat dissipation function.

As described above, in magnetic component unit 9 according to the present exemplary embodiment, coil component 10 is not disposed at the center of heat dissipator 13. Pressing portion 17 of magnetic core fixing portion 14 that fixes coil component 10 by a pressing force is disposed on heat dissipator 13 in a position closer to the center thereof than engagement fixing portion 11 and is joined to press fixing portion 12 provided on heat dissipator 13. Only one side of magnetic core fixing portion 14 is fixed using fixing tool 18. Thus, the area on heat dissipator 13 which magnetic core fixing portion 14 occupies as seen in plan view is minimized. At the same time, magnetic component unit 9 according to the present exemplary embodiment has a reduced increase in area and the properties thereof related to the heat diffusion and the heat dissipation at heat dissipator 13 are high.

INDUSTRIAL APPLICABILITY

The magnetic component unit in the present disclosure has the effect of reducing the increases in area and volume and is useful in various electronic devices.

REFERENCE MARKS IN THE DRAWINGS

1 magnetic core
2 terminal portion
3 winding portion
4 coil component
5 heat dissipator
6 fixing member
7 joining portion
8 fixing means
9 magnetic component unit
10 coil component
10A magnetic core
10B, 10C magnetic core segment
11 engagement fixing portion
11A air-cored portion
12 press fixing portion
12A fixing hole
13 heat dissipator
14 magnetic core fixing portion
15 holding portion
15A, 15B end part
16 engaging portion
17 pressing portion
17A through-hole
18 fixing tool
19 peripheral edge portion
20 mounting surface
21 winding portion

The invention claimed is:

1. A magnetic component unit, comprising:

a coil component having a magnetic core;

a heat dissipator on which the coil component is mounted and which has an engagement fixing portion and a press fixing portion and is made of metal; and a magnetic core fixing portion made of metal and including a holding portion that presses against the coil component, an engaging portion that extends from a first end part of the holding portion toward the heat dissipator and has a turned-back end part, and a pressing portion that extends from a second end part of the holding portion toward the heat dissipator and has an end part bent into an L-shape, wherein the engagement fixing portion has a U-shape, and one end and another end of the engagement fixing portion are connected to a peripheral edge portion of the heat dissipator, the engagement fixing portion is provided protruding from the peripheral edge portion of the heat dissipator in a first direction perpendicular to a mounting surface of the heat dissipator, the engagement fixing portion engages the engaging portion, the press fixing portion has a columnar shape and is provided protruding from the heat dissipator in the first direction, the press fixing portion has a fixing hole punched in the first direction, the pressing portion has a through-hole punched in the first direction, the press fixing portion and the pressing portion are joined together by a fixing tool inserted through the through-hole and the fixing hole, and the coil component is held between the holding portion and the heat dissipator.

2. The magnetic component unit according to claim 1, wherein a height of the engagement fixing portion measured from the heat dissipator is greater than a height of the press fixing portion measured from the heat dissipator.

3. The magnetic component unit according to claim 1, wherein the press fixing portion and the heat dissipator are integrally formed.

4. The magnetic component unit according to claim 1, wherein the engagement fixing portion and the heat dissipator are integrally formed.

5. The magnetic component unit according to claim 1, wherein an area of the press fixing portion is equal to an area of contact between the press fixing portion and the pressing portion or greater than the area of contact between the press fixing portion and the pressing portion as seen in plan view.

6. The magnetic component unit according to claim 1, wherein the turned-back end part of the engaging portion has a V-shape or a U-shape.

* * * * *